United States Patent
Xin-LeBlanc

(10) Patent No.: US 7,106,038 B1
(45) Date of Patent: Sep. 12, 2006

(54) INCREASED OUTPUT RANGE AND DECREASED GAIN VARIATION PWM CIRCUIT AND METHOD

(75) Inventor: Jane Xin-LeBlanc, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 173 days.

(21) Appl. No.: 10/892,888

(22) Filed: Jul. 15, 2004

(51) Int. Cl.
*G05F 1/56* (2006.01)
(52) U.S. Cl. .................................. 323/288
(58) Field of Classification Search ............... 323/282, 323/288; 363/41; 327/175
See application file for complete search history.

(56) References Cited

U.S. PATENT DOCUMENTS

| | | | | |
|---|---|---|---|---|
| 5,367,247 A * | 11/1994 | Blocher et al. | ............. | 323/222 |
| 5,436,550 A * | 7/1995 | Arakawa | .................... | 323/222 |
| 5,659,460 A * | 8/1997 | Vinciarelli | ............... | 363/21.03 |
| 5,818,207 A * | 10/1998 | Hwang | ....................... | 323/288 |
| 6,034,513 A * | 3/2000 | Farrington et al. | ......... | 323/222 |
| 6,057,675 A * | 5/2000 | Tateishi | ...................... | 323/283 |
| 6,229,293 B1 * | 5/2001 | Farrenkopf | ................. | 323/288 |
| 6,275,019 B1 * | 8/2001 | Fisher | ......................... | 323/288 |
| 6,448,752 B1 * | 9/2002 | Umemoto | ................... | 323/288 |
| 6,943,504 B1 * | 9/2005 | York | ......................... | 315/224 |
| 7,019,504 B1 * | 3/2006 | Pullen et al. | ............... | 323/283 |

OTHER PUBLICATIONS

Robert W. Erickson; "Fundamentals of Power Electronics, Second Edition"; Kluwer Academic Publishers, 2001; pp. 188, 253-256.

* cited by examiner

*Primary Examiner*—Jeffrey Sterrett
(74) *Attorney, Agent, or Firm*—Brett A. Hertzberg; Merchant & Gould PC

(57) ABSTRACT

A pulse-width modulator (PWM) accommodates a wider range of output pulse widths, with less gain variation, when compared to conventional circuits. The PWM can operate without requiring a voltage reference. In one example PWM, a ramp generator in the PWM includes a capacitive element that is charged by a current from a trans-conductance cell that is responsive to the input voltage and a power supply voltage. In another example PWM, the ramp generator cell in the PWM includes a follower circuit that is responsive to the input voltage. The PWM is suitable for use in a variety of applications including switching power converters.

14 Claims, 7 Drawing Sheets

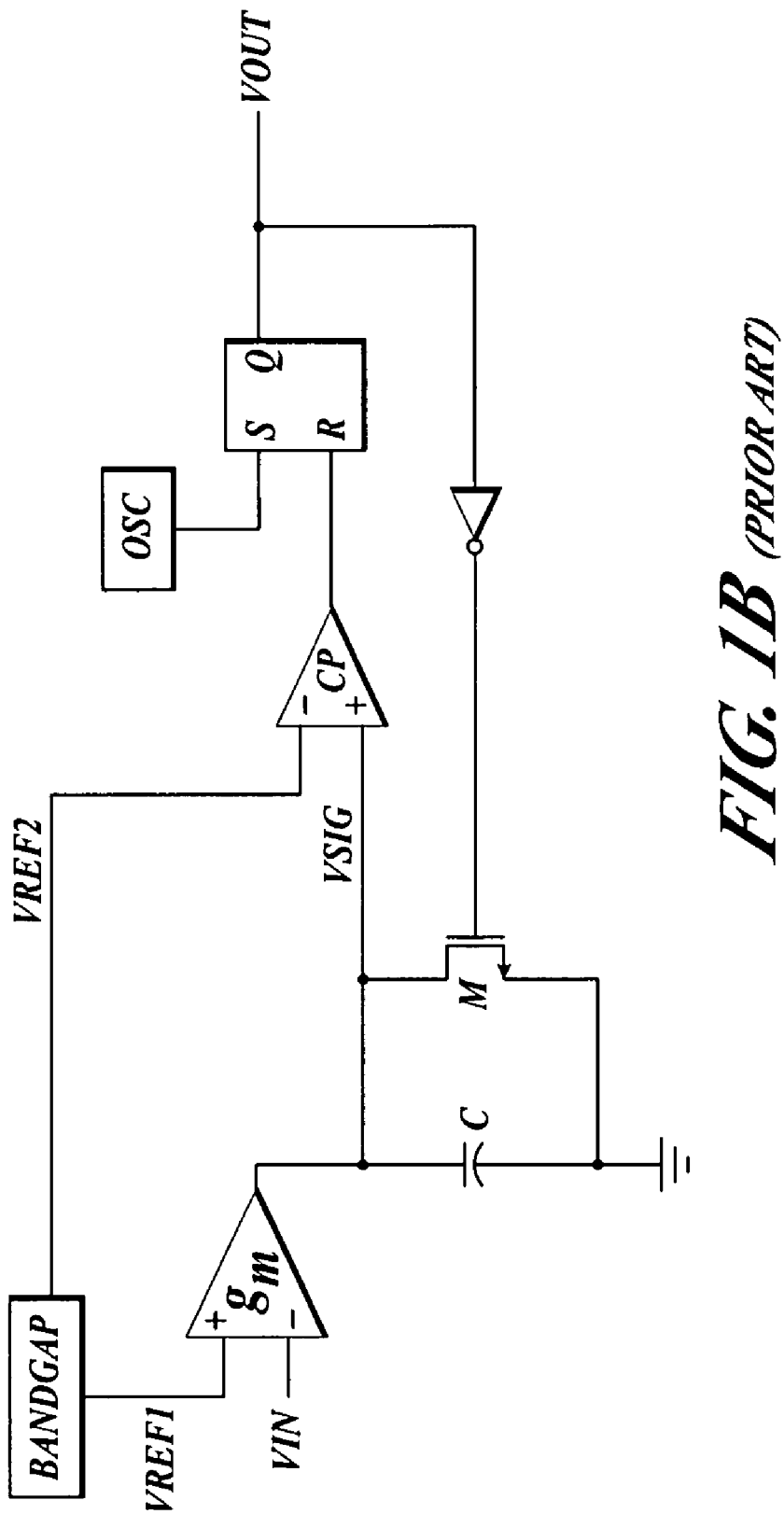
FIG. 1B *(PRIOR ART)*

INCREASED OUTPUT RANGE AND DECREASED GAIN VARIATION PWM CIRCUIT AND METHOD

FIELD OF THE INVENTION

The present invention generally relates to pulse-width modulators (PWM). An apparatus and method for a PWM can be arranged to operate with increased output range and decreased gain variations.

BACKGROUND OF THE INVENTION

Pulse-width modulator (PWM) circuits can be used in a variety of applications such as switching power converters. In a switching converter, the PWM circuit is typically arranged to provide a digital logic signal that has a pulse width that is a function of an analog input voltage. Example PWM circuits are illustrated in FIG. 1A and FIG. 1B.

The circuit illustrated in FIG. 1A includes a current source (I), a capacitor (C), a switching transistor (M), an inverter, a comparator (CP), an oscillator (OSC), and an SR-type flip-flop. The oscillator is arranged to set the SR-type flip-flop at regular intervals, initiating the start of the output pulse (VOUT). The inverter is arranged to provide an inverse of the output voltage (VOUT) to switching transistor M such that switching transistor M is deactivated when the output pulse is initiated. Current source I works with capacitor C to generate a voltage ramp ($V_C = I*t/C$) to one input of comparator CP while transistor M is deactivated. Comparator CP is arranged to reset the SR-type flip-flop whenever the analog input voltage (VIN) and the voltage ramp are equal, whereby the output pulse is terminated. Transistor M discharges capacitor C after the SR-flip-flop is reset. The pulse width (PW1A) for the circuit described above with respect to FIG. 1A is given by: PW1A=VIN*C/I.

The circuit illustrated in FIG. 1B includes a bandgap voltage reference, a trans-conductance (gm) cell, a capacitor (C), a switching transistor (M), an inverter, a comparator (CP), an oscillator (OSC), and an SR-type flip-flop. The oscillator is arranged to set the SR-type flip-flop at regular intervals, initiating the start of the output pulse (VOUT). The inverter is arranged to provide an inverse of the output voltage (VOUT) to switching transistor M such that switching transistor M is deactivated when the output pulse is initiated. Current is provided to charge capacitor C from the gm cell to generate a voltage ramp ($V_C$=(VREF1−VIN)*gm*t/C) to one input of comparator CP while transistor M is deactivated. Comparator CP is arranged to reset the SR-type flip-flop whenever a reference voltage (VREF2) and the voltage ramp ($V_C$) are equal, whereby the output pulse is terminated. Transistor M discharges capacitor C after the SR-flip-flop is reset. The pulse width (PW1B) for the circuit described above with respect to FIG. 1B is given by: PW1B=VREF2*C/(gm*[VREF1−VIN]).

BRIEF DESCRIPTION OF THE DRAWINGS

Non-limiting and non-exhaustive embodiments of the present invention are described with reference to the following drawings.

FIGS. 1A and 1B are schematic illustrations of conventional PWM circuits.

DETAILED DESCRIPTION OF THE PREFERRED EMBODIMENT

Figure 1A:
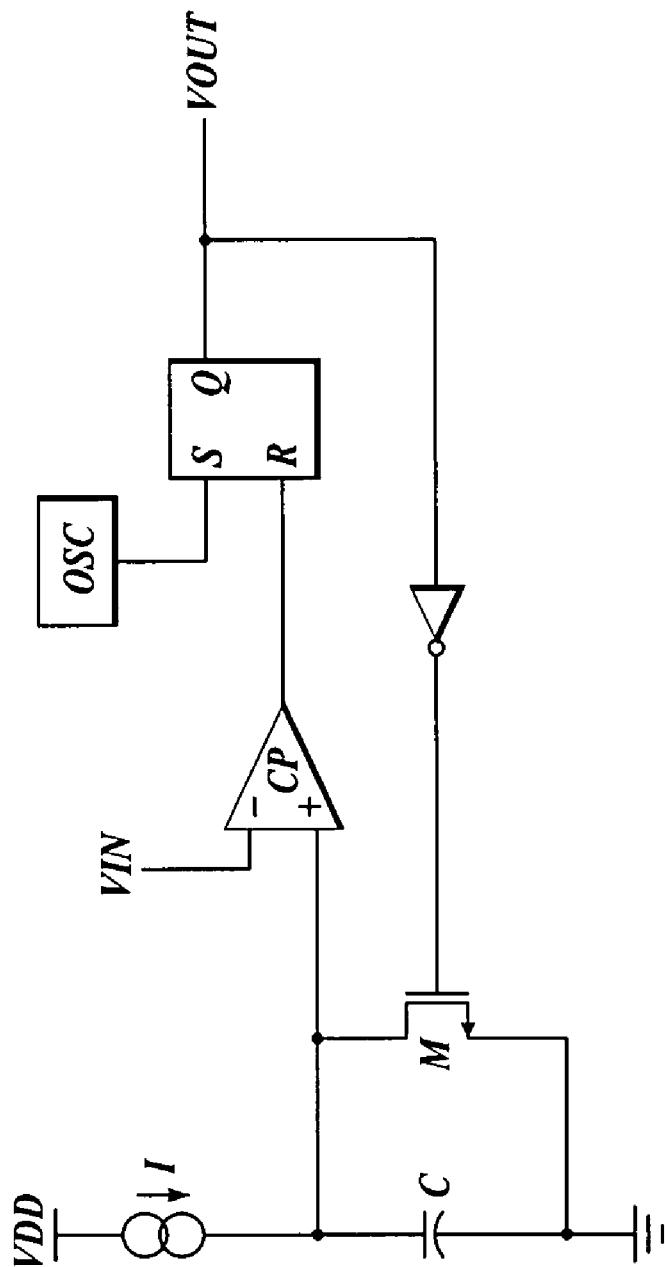

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other signal.

Briefly stated, a pulse-width modulator (PWM) arranged in accordance with the present invention accommodates a wider range of output pulse widths, with less gain variation, when compared to conventional circuits. The PWM can operate without requiring a voltage reference. In one example PWM, a ramp generator in the PWM includes a capacitive element that is charged by a current from a trans-conductance cell that is responsive to the input voltage and a power supply voltage. In another example PWM, the ramp generator cell in the PWM includes a follower circuit that is responsive to the input voltage. The PWM is suitable for use in a variety of applications including switching power converters.

Figure 2:
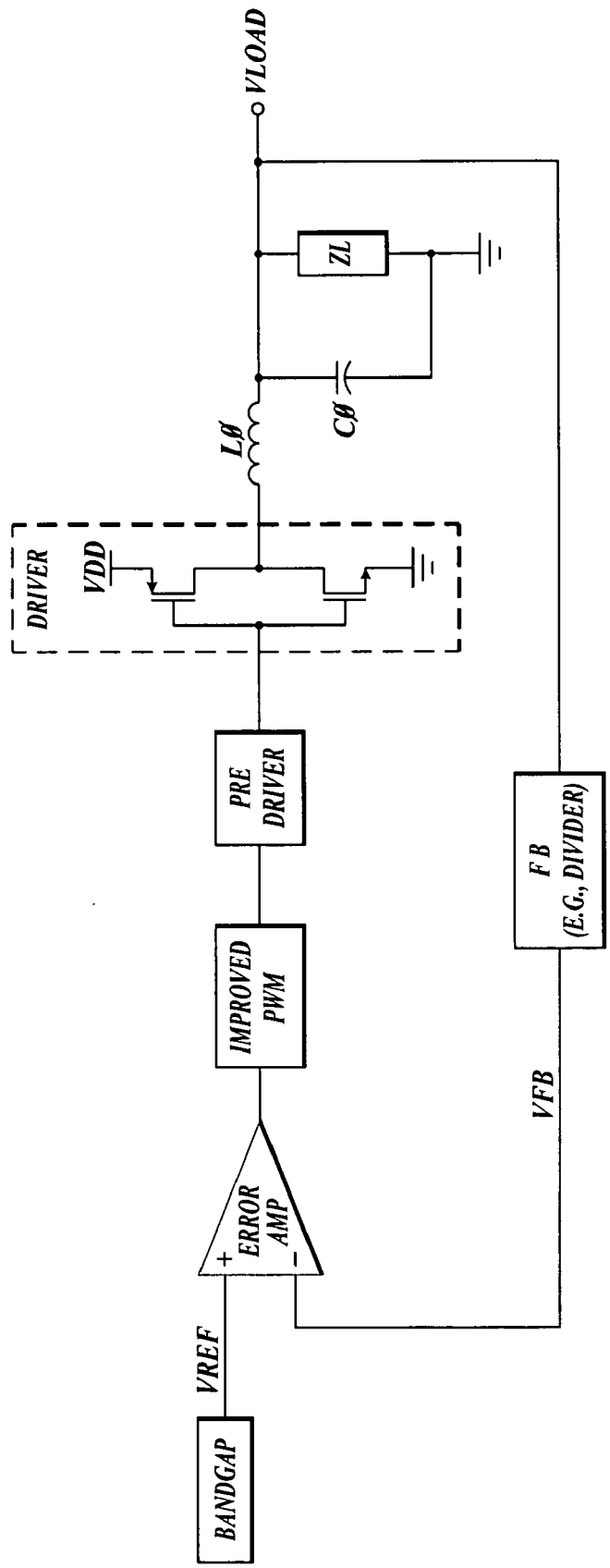
FIG. 2 is a schematic illustration of an example operating environment for the improved PWM in a switching regulator.

FIG. 2 is a schematic illustration of an example operating environment for the improved PWM in a switching regulator application. The switching regulator includes an error amplifier circuit, an improved PWM circuit, a pre-driver circuit, a driver circuit, an inductor (L0), a capacitor (C0), a load (ZL), and a feedback (FB) circuit.

The error amplifier is arranged to compare a reference voltage (VREF) to a feedback voltage (VFB) to form a control loop in the system. The output of the error amplifier is a control signal that is coupled to the improved PWM circuit, which is arranged according to at least one aspect of the present invention. The output of the PWM circuit is an output pulse that has an associated pulse-width that is responsive to the control signal. The output pulse is coupled to a pre-driver circuit that is arranged to control switching in the driver circuit, which is illustrated as a set of power switching transistors. The output of the driver circuit is coupled through the inductor to the parallel combination of the capacitor (C0) and the load circuit (ZL) such that an output voltage (VLOAD) is generated across the load. An optional feedback circuit such as a voltage divider circuit, a gain scaling circuit, or some other circuit can process the output voltage to provide the feedback voltage (VFB).

Although the above-described example illustrates the operation of a switching power converter (e.g., a buck converter, a boost converter, a buck-boost converter, etc.), the application of the described PWM is not so limited. It is expected that any application that requires a PWM can employ the described functionality and methods that are described herein.

Figure 3:
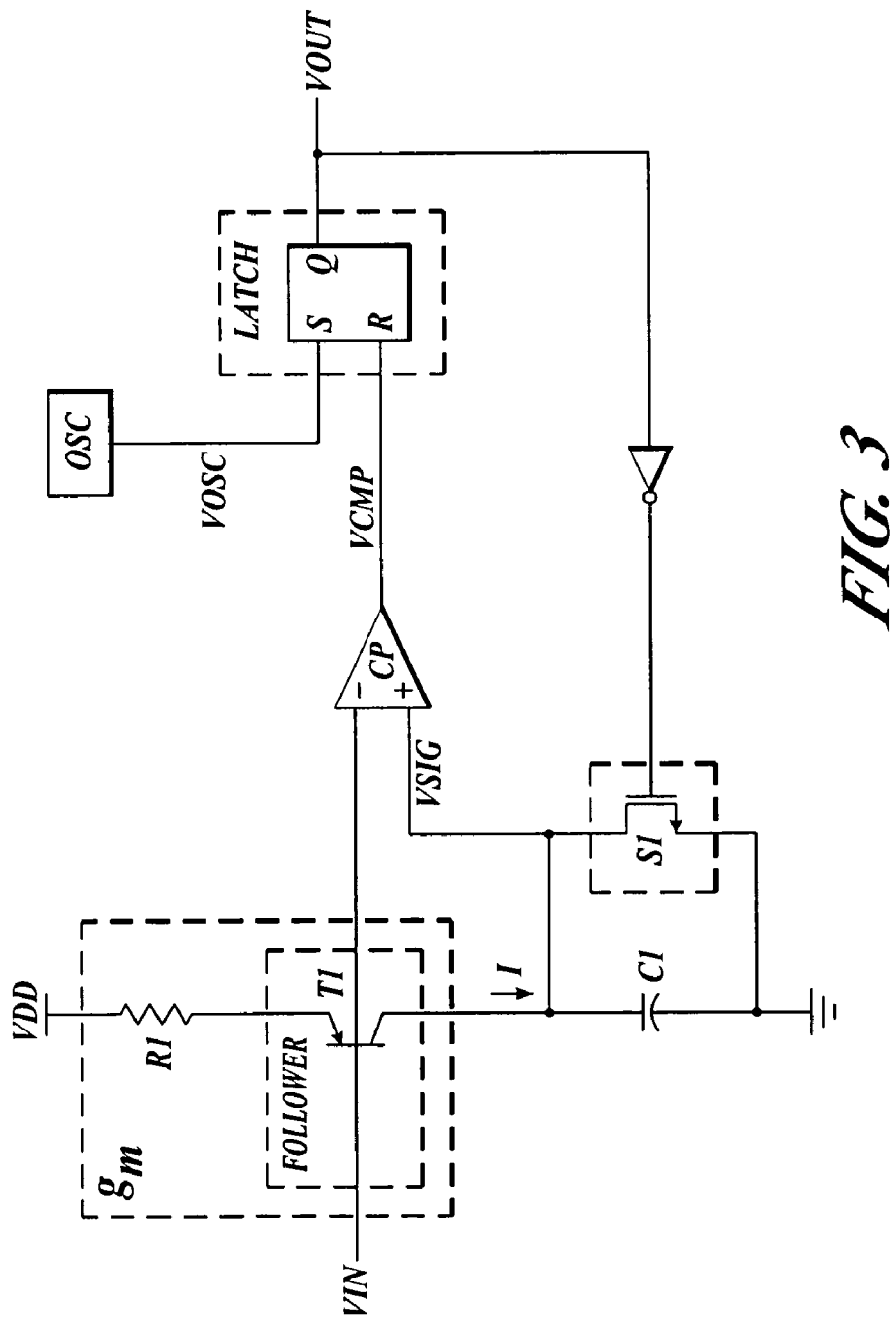
FIG. 3 is a schematic illustration of an improved PWM circuit.

FIG. 3 is a schematic illustration of an improved PWM circuit that is arranged according to at least one aspect of the present invention. The improved PWM circuit includes a trans-conductance circuit (gm), a capacitor (C1), a comparator (CP), a latch, an oscillator (OSC), a switching circuit (S1), a logic circuit, and an oscillator (OSC).

In operation, the oscillator provides an oscillation signal (VOSC) to the set input of the latch circuit (e.g., an SR-type flip-flop circuit), to initiate an output pulse (VOUT). The switching circuit (S1) is deactivated when the output pulses such that a ramp signal (VSIG) can be generated by the trans-conductance and the capacitor circuit (C1). After the ramp signal (VSIG) reaches the input signal (VIN), the comparator circuit resets the latch circuit and the process can be initiated again in response to the oscillation signal (VOSC).

The trans-conductance circuit is responsive to the input signal (VIN) to provide a current (I) to the capacitor circuit (C1) whenever the switching circuit (S1) is deactivated. The capacitor circuit (C1) cooperates with the trans-conductance circuit to provide a ramp signal (VSIG) that is given by: VSIG=Vinit+(I*dt/C). Vinit corresponds to the low power supply potential, which is ground for the example illustrated in FIG. 3.

In FIG. 3, the trans-conductance circuit corresponds to a follower circuit (e.g., an emitter follower) that is coupled to a power supply voltage through a resistance circuit (R1). For this example, the current (I) is given by:

$$I=(VDD-Vbe-VIN)/R1 \quad \text{Eq. 1}$$

The current (I) is also given by:

$$I=C1*dV/dt \quad \text{Eq. 2}$$

The change in voltage is determined by the trip-level for comparator CP such that dV=VIN (assuming ground is 0 volts). Solving for the pulse width (PW) is given by:

$$PW=VIN*C1/I$$

$$PW=VIN*C1*R1/(VDD-Vbe-VIN) \quad \text{Eq. 3}$$

For the example illustrated in FIG. 3, the logic circuit is simply an inverter circuit. Other digital circuits can be employed to condition the output signal and control the switching of switching circuit S1. Moreover, other circuits can be placed between the output and the switching circuit (S1) to provide signal conditioning functions such as low pass filtering, high pass filtering, time delay, phase shifting, and the like.

The latch circuit illustrated in FIG. 3 is illustrated as an SR-type flip-flop circuit that is level triggered. Other latch circuits can be employed such as an edge triggered latch, an edge triggered flip-flop or some other latching mechanism.

Figure 4B:
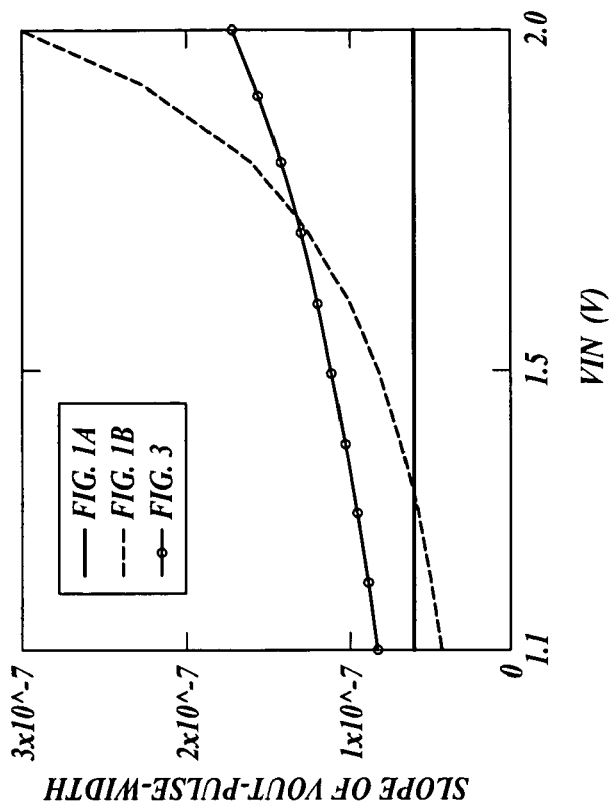
FIGS. 4A and 4B are graphs illustrating the performance differences between conventional PWM circuits and the improved PWM circuit.
Figure 4A:
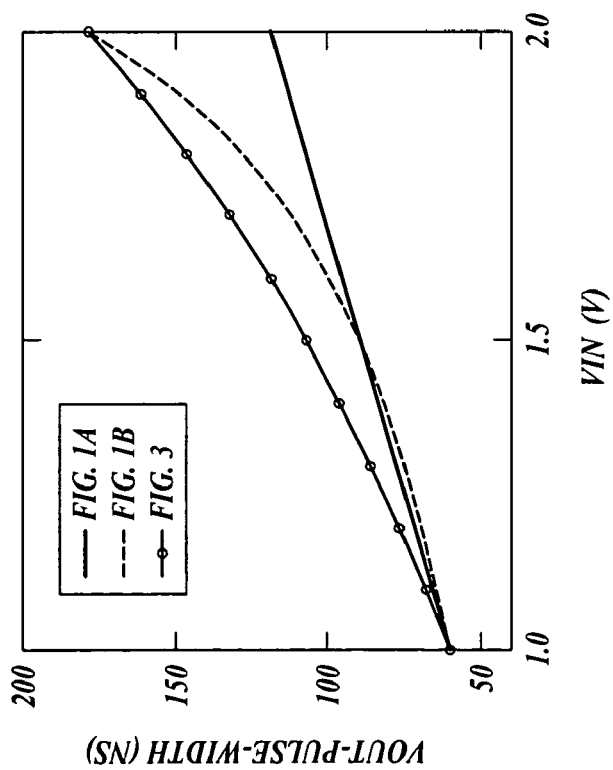

FIGS. 4A and 4B are graphs illustrating the performance differences between conventional PWM circuits and the improved PWM circuit described according to at least one aspect of the present invention. FIG. 4A illustrates the range of output pulse-widths that are supported for each topology over a range of input voltages (VIN), while FIG. 4B illustrates the slope of the output pulse-widths that are supported for each topology over a range of input voltages.

As illustrated by FIGS. 4A and 4B, the topology from FIG. 1A has a pulse-width that is linearly related to the input voltage (VIN) with a constant gain that corresponding to C/I. One way to extend the range of the output pulse widths supported by the FIG. 1A topology is to design a programmable current level (I) or a programmable capacitance level (C). The resulting programmable circuit is rather complex and may require additional algorithmic processing to adjust the various values. The topology from FIG. 1B has a wider output pulse width range than that illustrated in FIG. 1A. However, the gain variation for the topology of FIG. 1B is greater than that for FIG. 1A, and the circuit implementation requires generation of reference voltages VREF1 and VREF2.

The schematic illustrated by FIG. 3 includes a mix of the benefits of the circuits from both FIG. 1A and FIG. 1B, while including additional benefits not realized by the conventional circuits. For example, FIG. 3 does not require the additional circuitry necessary to provide reference voltage as in FIG. 1B, while providing a wide range of pulse widths, and while avoiding excessive gain variation similar to FIG. 1A.

Figure 5:
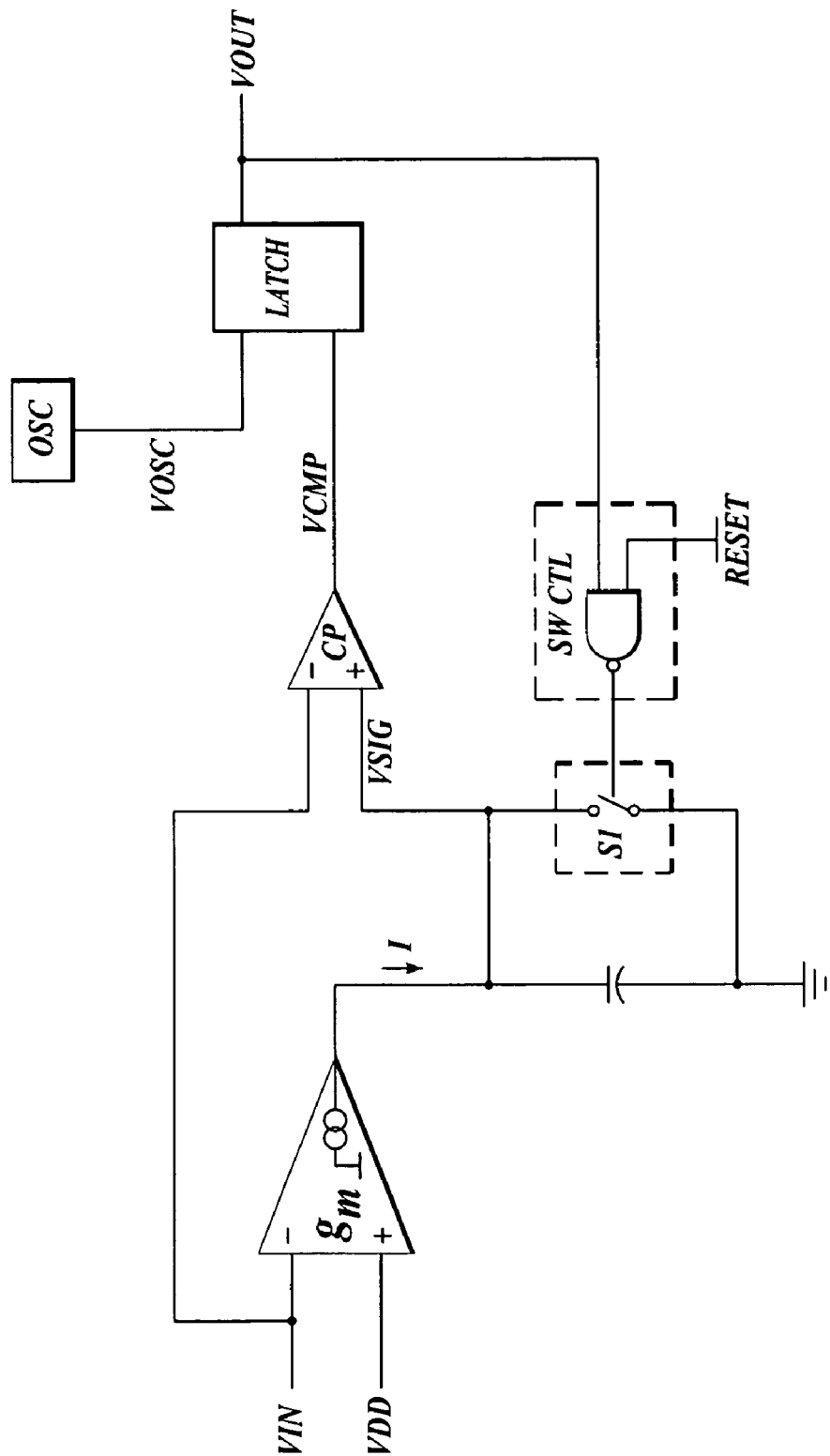
FIGS. 5 and 6 are schematic illustrations of another improved PWM circuit, arranged in accordance with at least one aspect of the present invention.
Figure 6:
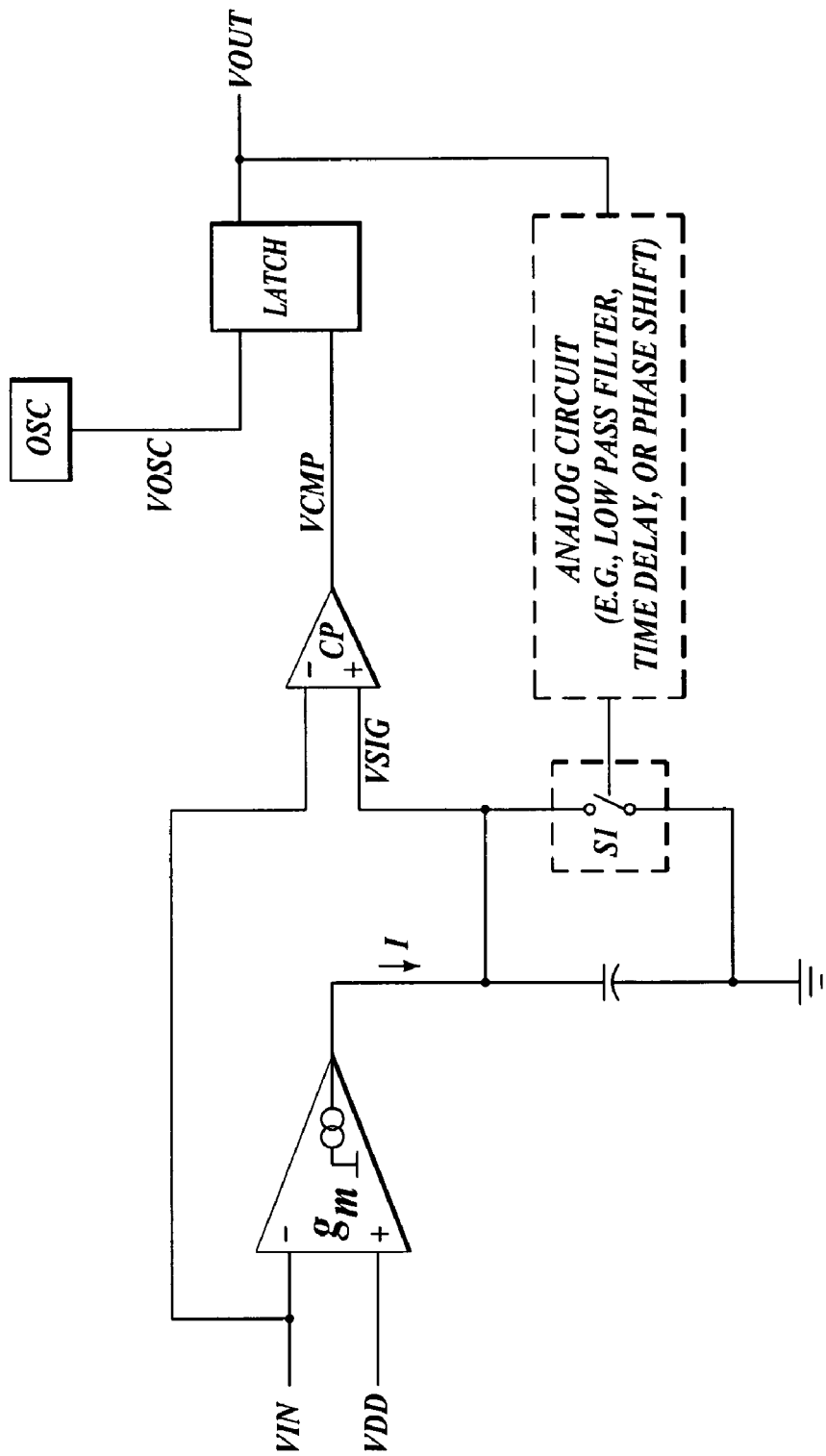

FIG. 5 is a schematic illustration of another improved PWM circuit that is arranged in accordance with at least one aspect of the present invention. The improved PWM circuit of FIG. 5 includes a trans-conductance circuit (gm), a capacitor (C1), a comparator (CP), a latch, an oscillator (OSC), a switching circuit (S1), a switch control circuit (SWCTL), and an oscillator (OSC).

The overall operation of the circuit illustrated in FIG. 5 is similar to that previously described with respect to FIG. 3. However, the switch control circuit (SWCTL) may include a number of digital and/or analog circuits. For the example switch control circuit shown in FIG. 5 includes a NAND logic gate that includes a reset control signal (RESETB), which can be used during a power-on reset condition (POR) or some other reset condition.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. An apparatus for generating an output signal with an adjustable pulse width that is responsive to an input signal, comprising:
    a ramp circuit that is arranged to provide a ramp signal that has a slope, wherein the slope of the ramp signal is responsive to the input signal;
    a switch control circuit that is arranged to provide a switch control signal in response to the output signal;
    a switch circuit that is arranged to cooperate with the ramp circuit such that the ramp signal is reset to an initial condition in response to the switch control signal;
    a comparator circuit that is arranged to provide a comparison signal in response to a comparison between the input signal and the ramp signal; and a latch circuit that is arranged to: set the output signal to a first logic level in response to an oscillator signal, and reset the output signal to a second logic level in response to the comparison signal, wherein the first logic level and the second logic level are inverse with respect to one another.

2. The apparatus of claim 1, the ramp circuit comprising:
a trans-conductance circuit that is arranged to provide a current that is responsive to the difference between the input signal and a power supply signal; and
a capacitor circuit that is coupled to the trans-conductance circuit such that the capacitor circuit generates the ramp signal in response to the current.

3. The apparatus of claim 2, the trans-conductance circuit comprising:
a follower circuit that is arranged to receive the input signal; and
a resistor circuit that is arranged to couple the follower circuit to the power supply signal.

4. The apparatus of claim 2, the trans-conductance circuit comprising:
a transistor that includes a base, a collector, and an emitter, wherein the base is arranged to receive the input signal and the collector is coupled to the capacitor circuit; and
a resistor circuit that is coupled between the power supply signal and the emitter of the transistor.

5. The apparatus of claim 2, the switch circuit comprising a transistor circuit that is arranged to discharge the capacitor circuit to the initial condition in response to the switch control signal.

6. The apparatus of claim 1, the switch control circuit comprising at least one of: an electrical connection that is coupled between the output signal and the switch circuit, a digital logic circuit, an analog signal processing circuit, an inverter logic circuit, a nand logic circuit, a low pass filter circuit, a high pass filter circuit, a time delay circuit, and a phase shift circuit.

7. The apparatus of claim 1, the latch circuit comprising at least one of: a level triggered latch, an edge triggered latch, a flip-flop circuit, and a SR-type flip-flop circuit.

8. The apparatus of claim 1, further comprising an oscillator circuit that is arranged to provide the oscillator signal.

9. An apparatus for generating an output signal with an adjustable pulse width that is responsive to an input signal, comprising:
a ramp means that is arranged to provide a ramp signal, wherein the ramp means is configured such that a slope associated with the ramp signal is responsive to the input signal;
a switch means that is arranged to reset the ramp signal to an initial condition in response to a switch control signal;
a comparison means circuit that is arranged to provide a comparison signal in response to a comparison between the input signal and the ramp signal; and
a latch means that is arranged to: set the output signal to a first logic level in response to an oscillator signal, and reset the output signal to a second logic level in response to the comparison signal, wherein the first logic level and the second logic level are inverse with respect to one another.

10. A method for generating an output signal with an adjustable pulse width that is responsive to an input signal, comprising:
setting the output signal to a first logic level in response to an oscillator signal;
adjusting a level associated with a current in response to the input signal;

charging a capacitor with a current when the output signal corresponds to the first logic level;
resetting the output signal to a second logic level when a voltage associated with the capacitor exceeds the input voltage, wherein the second logic level is an inverse of the first logic level; and
discharging the capacitor when the output signal corresponds to the second logic level.

11. A switching power converter, comprising:
an error amplifier that is arranged to compare a reference signal to a feedback signal to provide an error signal;
a driver circuit that is arranged to drive a load circuit in response to a pulse signal such that the load circuit generates an output signal;
a feedback circuit that is arranged to provide the feedback signal to the error amplifier in response to the output signal; and
a pulse-width modulator circuit that is response to the error signal to provide the pulse signal, wherein the pulse-width modulator comprises:
a trans-conductance circuit that is responsive to the error signal to provide a current;
a capacitor circuit that is arranged to receive the current to generate a ramp signal when the pulse signal corresponds to a first logic level;
a switch circuit that is arranged to discharge the capacitor circuit when the pulse signal corresponds to a second logic level;
a comparator circuit that is arranged to compare the ramp signal to the error signal to generate a comparison signal; and
a latch circuit that is arranged to set the pulse signal to the first logic level in response to an oscillator signal, and also arranged to reset the pulse signal to a second logic level in response to the comparison signal.

12. The switching power converter of claim 11, the trans-conductance circuit comprising:
a follower circuit that is arranged to receive the error signal; and
a resistor circuit that is arranged to couple the follower circuit to a power supply signal.

13. The switching power converter of claim 11, the trans-conductance circuit comprising:
a transistor that includes a base, a collector, and an emitter, wherein the base is arranged to receive the error signal and the collector is coupled to the capacitor circuit; and
a resistor circuit that is coupled between a power supply signal and the emitter of the transistor.

14. A switching power converter method, comprising:
driving a load circuit in response to a pulse signal to generate an output signal;
providing a feedback signal to an error amplifier;
comparing the feedback signal to a reference signal to generate an error signal;
setting the pulse signal to a first logic level in response to an oscillator signal;
adjusting a level associated with a current in response to the error signal;
charging a capacitor with the current when the pulse signal corresponds to the first logic level such that the capacitor generates a ramp signal;
resetting the pulse signal to a second logic level when the ramp signal reaches the error signal, wherein the second logic level is an inverse of the first logic level; and
discharging the capacitor when the pulse signal corresponds to the second logic level.

* * * * *